United States Patent [19]

Danon et al.

[11] Patent Number: 5,505,863
[45] Date of Patent: Apr. 9, 1996

[54] PROCESSING WASTE WASHOUT LIQUID CONTAINING PHOTOPOLYMER FROM PRINTING PLATE MANUFACTURE

[75] Inventors: Richard Danon, Leeds; Brian Clegg, Huddersfield, both of Great Britain

[73] Assignee: Dantex Graphics Limited, Bradford, United Kingdom

[21] Appl. No.: 211,638

[22] PCT Filed: Oct. 9, 1992

[86] PCT No.: PCT/GB92/01850

§ 371 Date: Apr. 8, 1994

§ 102(e) Date: Apr. 8, 1994

[87] PCT Pub. No.: WO93/07539

PCT Pub. Date: Apr. 15, 1993

[30] Foreign Application Priority Data

Oct. 9, 1991 [GB] United Kingdom ............ 9121317

[51] Int. Cl.$^6$ ............ B01D 35/18; B01D 33/06
[52] U.S. Cl. ............ 210/774; 210/781; 210/175; 210/186; 210/360.1; 210/380.1; 210/484; 210/485; 210/493.1; 354/324; 354/326; 494/36
[58] Field of Search ............ 494/36; 210/781, 210/175, 186, 360.1, 380.1, 358, 399, 484, 485, 493.1, 774; 354/320, 325, 326, 327

[56] References Cited

U.S. PATENT DOCUMENTS

| | | | |
|---|---|---|---|
| 4,052,304 | 10/1977 | Vertenstein | 494/36 |
| 4,239,368 | 12/1980 | Krause et al. | 354/325 |
| 4,752,283 | 6/1988 | Copeland et al. | 354/324 |
| 4,796,042 | 1/1989 | Mappin et al. | 354/324 |
| 4,944,874 | 7/1990 | Kobayashi et al. | 210/232 |
| 5,124,736 | 6/1992 | Yamamoto et al. | 354/320 |
| 5,128,008 | 7/1992 | Shelstad | 210/360.1 |
| 5,140,356 | 8/1992 | Ohba et al. | 354/320 |
| 5,176,825 | 1/1993 | Hadjis et al. | 210/360.1 |
| 5,317,964 | 6/1994 | Prudhomme | 494/36 |

FOREIGN PATENT DOCUMENTS

| | | |
|---|---|---|
| 0004326 | 10/1979 | European Pat. Off. |
| 0411939 | 2/1991 | European Pat. Off. |
| 3102135A1 | 8/1982 | Germany |
| 3641269 | 6/1988 | Germany |

*Primary Examiner*—Robert A. Dawson
*Assistant Examiner*—Robert James Popovics
*Attorney, Agent, or Firm*—Cushman Darby & Cushman

[57] ABSTRACT

Waste washout liquid containing liquid washable photopolymer from a printing plate manufacturing process is subjected to filtration via a centrifugal filter unit. The unit has a collector for the solid material arranged for rotation and disposed so as to allow deposition upon it of solid material during its rotation. The unit is fitted with at least one of a pretreatment unit for coagulating the solid material and a collector removable from the filter unit so as to allow its disposal together with the solid material deposited on it. Usually, the pretreatment unit is a preheater and the collector is a disposable liner within a rotatable chamber.

21 Claims, 3 Drawing Sheets

PROCESSING WASTE WASHOUT LIQUID CONTAINING PHOTOPOLYMER FROM PRINTING PLATE MANUFACTURE

This invention relates to the processing of waste washout liquid containing liquid washable photopolymer from a plant for manufacturing a printing, especially a relief printing, plate using a filter unit of the rotary gravitational separator type, that is to say, of the centrifuge type. In particular, the invention relates to a filter unit comprising such a filter, to the use of such a filter in such processing and to processes for the separation of solid material from the washout liquid using such a filter unit.

Typically, such a centrifuge type filter unit includes a chamber mounted for rotation about an axis of symmetry. It is usually generally cylindrical and is rotatable about its longitudinal axis which may extend horizontally but more usually extends vertically.

A problem with existing centrifuges is that it is difficult to remove from them the solids which have been separated during the operation of the centrifuge. At the end of the operation of the centrifuge there is normally present a quantity of solid/liquid mixture within the centrifuge, and a layer of separated solid compressed against the inner peripheral wall of the chamber. Removal of the separated solid from the chamber is particularly difficult where it is desired not to mix such solid with the solid/liquid mixture within the chamber.

According to one aspect, the present invention provides the use of a centrifugal filter unit, ie. a filter unit of the rotary gravitational separator type, for the separation of a solid material from a waste washout liquid containing liquid washable photopolymer from a printing plate manufacturing process, which filter unit comprises a centrifugal filter chamber rotatable so as to allow deposition of the solid material from the waste washout liquid, and a collector removable from but retainable within the chamber for collection of the deposited solid material, and means for releasably retaining the collector within the chamber, which collector comprises a bag having a plurality of projections extending inwardly of the bag, such as flaps, corrugations or pleats. Thus the bag may be folded so as to gather pleats sewn in position at top and bottom end regions of the bag, which pleats are open between their top and bottom ends.

According to another aspect, the invention provides a centrifugal filter unit for separation of solid material from a waste washout liquid containing liquid washable photopolymer from a printing plate manufacturing process, which filter unit comprises a centrifugal filter chamber rotatable so as to allow deposition of the solid material from the waste washout liquid, a collector removable from but retainable within the chamber for collection of the deposited solid material, and means for releasably retaining the collector within the chamber, which collector comprises a bag having a plurality of projections extending inwardly of the bag, as described above.

According to a further aspect, the invention provides a centrifugal filter unit for separation of solid material from a waste washout liquid containing liquid washable photopolymer from a printing plate manufacturing process, which filter unit comprises, a preheater unit capable of coagulating photopolymeric waste washout liquid, a centrifugal filter chamber rotatable so as to allow deposition of the solid material from the waste washout liquid, a collector removable from but retainable within the chamber for collection of the deposited solid material, and means for releasably retaining the collector within the chamber.

The filter unit may optionally additionally comprise an openable lid of the chamber, at least one of the chamber and lid carrying the means for releasably retaining within the chamber (at least when the lid is closed) the removable collector. The collector retaining means may comprise at least one collector retaining clip attached to one of the chamber and the lid. The clip may be a circlip or a plurality of clips around the top of the chamber. Preferably the mouth of the chamber is profiled to provide a recess co-operable with a resilient retaining ring to trap the removable collector at its mouth portion. In any event, the collector retaining means should not adversely affect the seal between the lid and the chamber during rotation of the chamber.

The filter unit may be additionally provided with any one or more of means for pretreating, especially preheating, the washout liquid before its separation, means for feeding the washout liquid into the chamber, means for removing excess washout liquid from the chamber and means for retaining the disposable bag within the chamber whereby, after rotation, the separated solid can be removed, together with the bag, from the chamber.

Where a preheater, either separately or as part of the filter unit, is provided so as to allow heating of the washout liquid prior to its entry into the rotatable chamber, this heating action assists a partial coagulation of the solid material, thereby rendering the filtration more effective. Alternatively or additionally, the washout liquid may be pretreated with a coagulation aid.

Where the collector is a porous filter bag, by coagulating the solid material in this manner, the life of the porous filter bag can be considerably extended; in other words, the time taken before the bag becomes clogged ("blinded") with fine particles can be considerably increased.

As an alternative to the coagulation technique, the filter bag may be periodically washed, for example by a water jet spray device.

The collector may be a liner which takes the form of a module such as a cassette, or which merely takes the form of a bag.

It is especially preferred that the collector be a specially designed disposable filter medium which may incorporate a surface profile, for example a rough surface.

Projecting portions may extend inwardly of the circumference of the bag and may be provided, for example, by pleats, gussets, corrugations, flaps etc. as later described to assist solid material collection.

The chamber may be imperforate or perforate, depending on the configuration required in any particular application. Preferably, the chamber is perforate.

Where the chamber is imperforate, the collector is preferably a liner made from a waterproof material, impervious to both liquid and solid matter, such as polyethylene or a non-woven or textile fabric of synthetic and/or natural fibre. As the chamber rotates, separated solid will collect on the disposable liner, around the inside surfaces of the chamber. Separated liquid may be removed from the chamber by means of a pipe, an open end of which is near to an inside surface of the chamber, and is open in a direction which in use opposes the direction of rotation to "skim" the liquid from around the sides of the chamber. Alternatively, the separated liquid may simply be allowed to spill out over an open end of the chamber, rotation of the chamber forming a vortex of the liquid, which vortex, forces the liquid outwardly through the open end.

Where (as is especially preferred) the chamber is perforate, the unit preferably includes means for filtering and draining, conveniently by gravity, any excess liquid present in the chamber at the end of its rotation. This prevents the liquid from mixing with the separated solid collected against the chamber wall within the collector.

In the case where the drum is imperforate, the unit preferably includes means for draining from the chamber any excess liquid which is present at the end of its rotation or operating cycle. More preferably, such means may comprise a central feed-pipe through which liquid is pumped out of the chamber by means of an electric pump. The excess liquid may then be pumped back to source for separation during the next cycle of operation. Removal of the excess liquid from the chamber may be carried out automatically at the end of each operating cycle of the unit.

In the present invention the filter unit is used in the printing industry, where suspended photopolymer solids need to be separated out from waste materials, especially the waste washout fluids created in the production of photopolymer relief printing and moulding plates, using water as the wash out medium.

A filter unit in accordance with the present invention may be in a form such as to accept fluid waste in a continuous flow or in a predetermined volume, and may be controlled manually or otherwise.

The disposable collector to be used in accordance with the present invention may incorporate a surface profile for more efficient solid collection. A preferred such collector is generally in the shape of a bag, folded and sewn at least at its top, preferably at both its top and bottom ends, so as to gather a plurality of pleats open between their top and bottom ends. More preferably, the bag is arranged in the rotatable chamber so that mouth openings move rearwardly, ie. in the direction of rotation.

The disposable liner may be placed within and against the walls of the rotating chamber in the form of a bag, held in place by a retaining clip or clips. Otherwise, the disposable collector may be in a pre-fixed form such as housed within a wire mesh or disposable plastics cassette.

The filter unit may be used to separate any suspended solid from the fluid and subsequently to expel the filtered liquid to drain, to a subsequent filtration system or to a re-circulatory system. Means for removing any excess contaminated liquid from the chamber may comprise, for example, a conduit extending into the bottom of the chamber in which the liquid accumulates during use, through which conduit the excess liquid can be pumped out of the chamber, for instance by means of an electric pump, after rotation of the chamber has ceased.

The unit may be connected, for instance, to a washout unit of apparatus for the production of photopolymer printing plates, or to a holding tank or treatment vessel of such apparatus, such that waste fluid from the apparatus, containing suspended photopolymer solids, may be supplied to the filter unit for separation of the solids from the waste fluid. Where the waste fluid from the apparatus contains particularly small size suspended solid material, the waste fluid may be directed into a pre-filtration treatment chamber to assist the coagulation of the suspended solids within the waste fluid. Thereafter, the waste fluid may be supplied to the filter unit continuously or in separate fixed volumes.

Where the collector is a disposable bag, the means for retaining the disposable bag in position within the chamber may be any suitable means, such as a conventional retaining ring, for example a circlip, around the chamber, or a resilient ring arranged to cooperate with a recess in the mouth of the chamber so as to grip the bag, Alternatively, the disposable collector may be in a prefixed form, for example, in a wire mesh housing or a cassette of plastics material.

According to another aspect the invention also provides a process for separating solid material from a waste washout liquid washable photopolymer from a printing plate manufacturing process, which separating process comprises providing a centrifugal filter unit comprising a rotatable filter chamber, removably securing within the chamber a collector, which collector comprises a bag having a plurality of projecting portions extending inwardly of the bag, feeding the washout liquid into the chamber while rotating the chamber so as to allow centrifugal deposition of the solid material on the collector within the rotating chamber, whereby the projecting portions modify the flow of the washout liquid within the chamber during rotation thereof and thereby improve efficiency of deposition of the solid material on the collector, and thereafter, removing the collector and solid material deposited thereon from the chamber.

The projecting portions may be provided by folding of the bag so as to gather pleats sewn in position at top and bottom end regions of the bag, which pleats are open between their top and bottom ends, and the flow of the washout liquid is thereby modified by the open mouths of the pleats.

The process may additionally include, prior to the step of feeding the washout liquid into the centrifugal filter chamber, pretreating the washout liquid to coagulate the solid material therein.

The pretreatment step may comprise at least the steps of heating the washout liquid, preferably to a temperature of from 30° to 80° C. inclusive. Alternatively or additionally, coagulation may be effected by adding a coagulant to the washout material.

An especially preferred aspect of the invention provides a process which comprises the continuous steps of supplying the waste washout water to a preheater unit, heating the waste washout water in the preheater unit to coagulate solid material in the waste washout water, feeding the waste washout water containing the coagulated solid material to a centrifugal filter unit comprising a perforate rotating centrifugal filter chamber containing a collector comprising a removable pervious filtration bag, and collecting the coagulated solid material on the removable pervious filtration bag, while allowing permeation of the washout water through the pervious filtration bag and perforate rotating chamber, and after termination of the said continuous steps, removing the removable filtration bag containing the collected coagulated solid material.

The removable pervious filtration bag may be folded so as to gather pleats sewn in position at top and bottom end regions of the bag, which pleats are open between their top and bottom ends, whereby the open mouths of the pleats modify the flow of the washout liquid within the chamber during rotation thereof and thereby improve efficiency of deposition of the solid material on the said filtration bag.

The above processes are of particular use for the separation of the suspended solid particles of photopolymer, by filtration, from waste washout fluid created in the production of liquid washable, photopolymer, especially from relief printing and moulding plates. These plates, especially water washable types, are now extensively used in the printing industry. The production of a printing plate is generally carried out in the following manner: imagewise irradiation (main exposure); removal of unhardened areas (washout); drying of the resulting plate and post irradiation (post exposure). The removal of unhardened areas (washout) is generally carried out by the action of a jet-spray of water or by brushing the plate in water.

Recently, water washable type photopolymer plates have gained considerable market presence, and have replaced organic solvent washable type photopolymer plates. The most important reason for the popularity of water washable plates is the environmentally friendly working conditions in which they can be produced and processed, especially when compared to organic solvent type plates.

However, since waste washout fluid from the production of the plates includes a certain quantity of photopolymer resin which is dissolved, and also quantities of photopolymer "free floating" in the water (ie "suspended solid" material), it is important, when considering the separation of the photopolymer from the waste water, to respect environmental and legislative working conditions. The present invention gives an effective method for the treatment of waste washout fluid, and a filter unit of use in that method.

There are already known several different methods for separating the photopolymer from the waste fluid. However, these different methods are not popular since they are either prohibitively expensive or involve long treatment times or troublesome procedures.

We have made intensive and extensive studies in an attempt to overcome the abovementioned difficulties found in conventional treatment processes, with the ultimate aim of developing a simple, effective and economical working procedure for the task.

In the process of the invention, the waste washout liquid is preferably maintained, during the separation process, at a temperature from 10° C. to 80° C. inclusive, more preferably 15° C. to 80° C. inclusive, especially 20°–50° C., typically 25°–50° C., for example 45°–50° C., so as to optimise the efficiency of the process.

In order to assist the efficiency of the filter unit—as may be required in the case of particularly small size particles—a special pre-filtration treatment chamber may be constructed immediately ahead of the filter unit. This treatment chamber is used to assist the coagulation of the solid particles present in the waste wash out liquid. The coagulation may be achieved by increasing the temperature of the waste liquid by means of a specially constructed in-line heating device and/or by the addition of a coagulant to the washout liquid prior to the separation process. In a particularly preferred process, waste washout is fed continuously through the pretreatment chamber and thence through the centrifuge, this enabling, where desired, a steady continuous flow rate.

The coagulant may be inorganic (e.g. sodium chloride, sodium bromide, potassium chloride, calcium chloride, aluminium sulphate or sodium sulphate) or organic (e.g. polymethyl (meth)acrylate, a copolymer thereof with methacrylamide or a copolymer of maleic anhydride with a glycol capable of providing methylvinyl ether units).

BRIEF DESCRIPTION OF THE DRAWINGS

Embodiments of the present invention will now be described, by way of example only, and with reference to the accompanying drawings, in which.

IMPERFORATE CHAMBER

Figure 1:
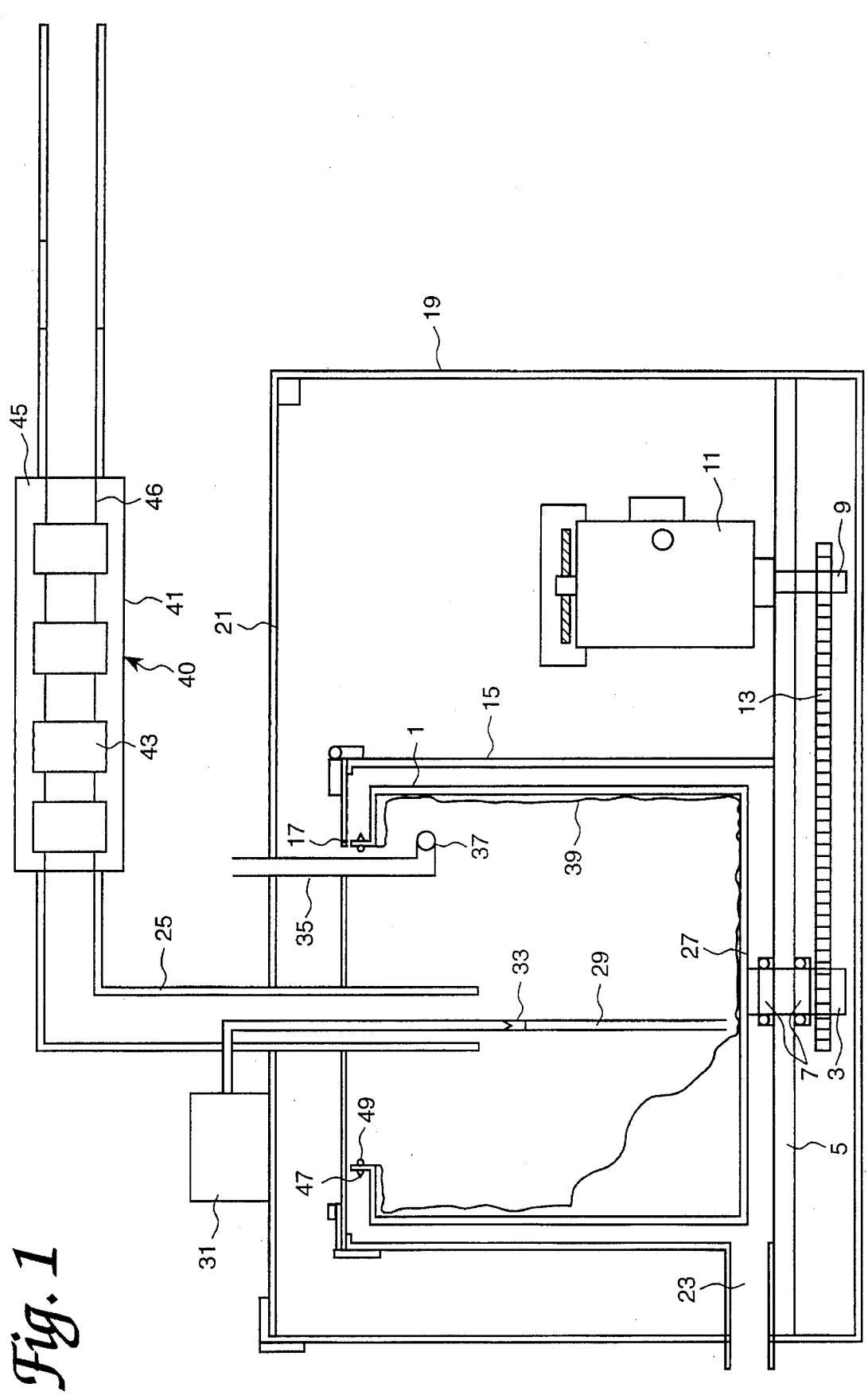
FIG. 1 shows diagrammatically a first embodiment of a filter unit in accordance with the invention.

Referring firstly to FIG. 1, a centrifugal filter unit embodying the invention includes a cylindrical chamber (1) mounted for rotation around its longitudinal axis on a drive-shaft (3). The chamber (1) is mounted on bearings (7) for rotational movement relative to a support frame (5). The drive shaft (3) is connected to a drive spindle (9) of an electric motor (11) by means of a drive belt (13). The chamber (1) is imperforate (see cut-away portion of the section shown in FIG. 1). It is located within an inner housing (15) having a hinged lid (17), and the whole assembly, including the electric motor (11), is located within an outer housing (19) also having a hinged lid (21). The inner housing (15) is provided with an outlet (23) which allows filtered liquid to exit to drain.

Extending into the chamber (1) along the longitudinal axis thereof, from outside the outer housing (19), is a feed pipe (25) which terminates within the chamber (1) about one-third of the way down from the top of the chamber. At a region outside the outer housing (19) this feed pipe (25) leads into and out of a prefiltration treatment unit (40).

The prefiltration unit (40) has a main flow pipe (46), heating elements (43) and insulation material (45) all housed within an outer casing (41), for example of stainless steel. Electronic control equipment (not shown) is also provided.

The flow pipe (46) is manufactured from copper or similar high temperature resistant and heat transmitting material and is typically 18" (457 mm) long. Effectively, pipe (46) defines a portion of the feed pipe (25) running, for example, from the drain of a photopolymerization washout catchment tray to the chamber (39).

Attached to and around this main flow pipe (46) are the electric heating elements (43). The elements (43) are fitted in line along the length of the pipe (46). The insulation material (45), typically mineral or ceramic material, especially ceramic powder, is fitted around the elements (43) and is packed tightly to expel air and to afford maximum performance.

The outer casing (41) has two main functions. The first is to contain the pipe (46), heating element (43) and insulation (45). The second is to support the pipe assembly within the processing unit as a whole, ensuring that the correct amount of drainage fall is obtained and maintained between the exit point of the catchment tray, pre-heat unit, and centrifugal filtration unit.

The electronic control equipment (not shown) is positioned remotely from the above assembly and connected via a wiring harness. Its function is to supply and control the electrical power for the heating elements (43) whilst maintaining a pre-set and adjustable temperature at the wall of the main flow pipe (46). The temperature may be within a range of from ambient to 300° C. The electronic control equipment may also incorporate an over-temperature protection circuit/device.

Under operating conditions, the prefiltration unit accepts waste wash-out fluid from the catchment tray of the wash-out system. As the fluid flows through the main pipe of the unit, it may be heated before passing to the entry point of the centrifugal filtration unit. The purpose of the heating action is to increase coagulation of the suspended solid particles within the waste fluid prior to, and thus aiding, the filtration process.

In addition to the prefiltration treatment unit (40), a suction pump (31) is also disposed outside and above the outer housing (19). A right-angled tube (29) of relatively narrow diameter has a first limb extending horizontally from the pump (31) and radially through the wall of and into the feed pipe (25) and a second limb extending downwardly from the right angle and generally concentrically within the pipe (25). The second limb of tube (29) extends considerably below the lower end of feed pipe (29) to a position just above base (27) of the chamber (1). The second limb of tube (29) is in fact in two parts, connected together by a flexible connector (33) which allows the lid (21) to be opened without breaking the tube (29).

Also extending into the chamber (1) is an extraction pipe (35) which extends parallel to, but spaced radially outwardly from, the feed pipe (25). The pipe (35) extends from a position above the lid (21) of the outer housing (19) into the chamber (1), terminating at a level above the lower end of the feed pipe (25). At its lower end, the pipe (35) extends radially outwardly for a small distance, and its open end (37) faces into the direction of rotation of the chamber (1). The position of the extraction pipe (35) is adjustable to afford optimum performance.

The chamber (1) is also provided with an inner liner in the form of a bag (39) which may be made of polyethylene or a similar material. The bag is impervious to both liquid and solid matter.

The chamber (1) has a slightly restricted opening defined by a short cylindrical lip which is profiled so as to provide a circumferential, generally V-shaped recess (47) in its internal wall. The bag (39) has a mouth portion which lies against the inner circumference of the internal wall and is held in position by a resilient retaining ring (49) which cooperates with the recess so as to trap a part of the mouth portion of the bag (39) between the profiled lip and the retaining ring (49). The trapped part of the mouth portion is thus urged into the recess (47) by the retaining ring (49), thus holding the bag (39) in position.

As an alternative to the above, or other form of retaining means, the disposable bag may be in a prefixed form such as housed within a wire mesh or a disposable plastics cassette. Indeed, the liner can be in any such form which is user friendly and/or easily disposable and/or of the recycleable type.

As described in more detail below with reference to FIG. 3, the disposable bag preferably has a pleated construction.

In use, the chamber (1) is rotated and liquid waste, typically containing suspended solid material, is fed, either batchwise or more preferably continuously, into the chamber (1) by means of the pipe (25). Extraction of separated liquid is achieved by means of the pipe (35) which "skims" the separated liquid from the chamber. Solids suspended in the liquid are forced out against the liner bag (39) to form a layer of separated solids (not shown).

In an alternative embodiment of the invention, pipe (35) may be removed, and separated liquid instead allowed to overflow out of the top of chamber (1), due to the formation of a vortex at the top of the chamber as it rotates.

At the end of an operating cycle, excess liquid falls to the bottom of the chamber (1) and is drained away via the tube (29) and the pump (31). This excess liquid may be pumped back to its source, for separation during the next cycle of operation.

The waterproof liner bag (39) is easily removed from the chamber (1) together with the separated solids. The liner and solids may be disposed of by incineration or other appropriate means. Thus, removal of separated solids from the filter unit, and also of any excess liquid which may still contain some solids, can be much more easily effected than in conventional units.

The chamber (1) may be made of spun stainless steel and the feed pipe (25), tube (29) and extraction pipe (35) may all be made from stainless steel, copper or plastics, depending on the particular use to which the filter unit is to be put.

PERFORATE CHAMBER

Figure 2:
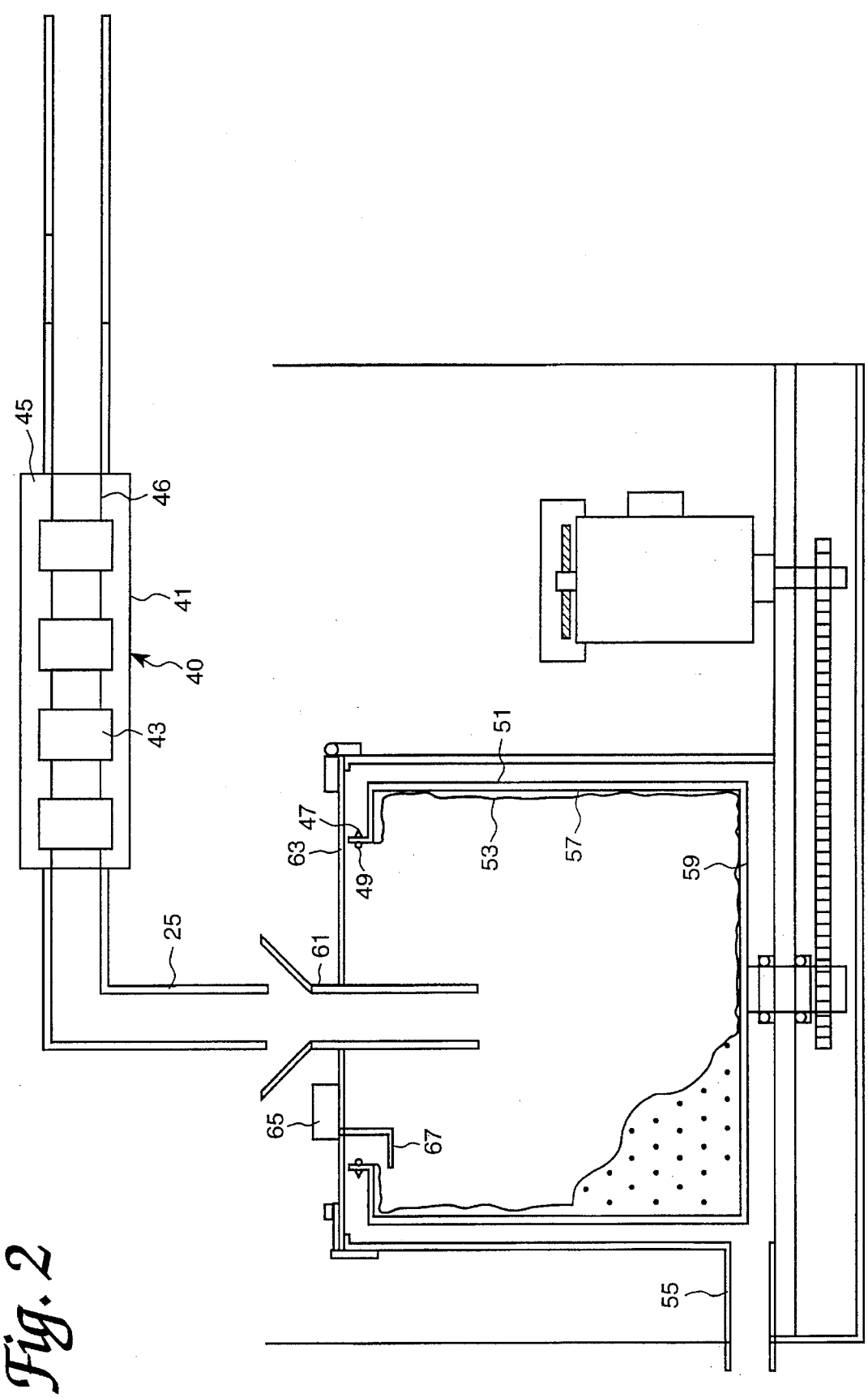
FIG. 2 shows diagrammatically a second embodiment of a filter unit in accordance with the invention.

Referring to FIG. 2 of the accompanying drawings, a second, especially preferred, embodiment of a centrifugal filter unit in accordance with the present invention includes components similar to those described with reference to FIG. 1, to which further reference will not be made. The chamber (51) is a rotatable drum which, in this case, is perforated (see cut-away portion) and the liner bag (53) is made of woven or non-woven fabric, textile or paper, such that water and very small particles can pass through it and exit to drain via drain pipe (55). The chamber (51) is perforated by means of holes in its entire cylindrical wall (57) and also in its base (59).

The unit includes a central feed pipe (61) extending through a hinged lid (63) and into the chamber (51) to a point about one-third of the way down the chamber along its longitudinal axis.

A sensing device (65) is provided with a sensing probe (67) located below the top of the chamber (51). This sensing device may be electro-mechanical and/or electronic, and detects the presence of liquid. In use, liquid entering the spinning chamber (51) is forced out against the cylindrical walls of the chamber. When separated liquid can no longer pass through the disposable liner bags/cassette (53) and the chamber walls, due to a large quantity of separated solid having collected in the liner, the depth of the liquid wall formed against the circular wall of the chamber will increase until the liquid reaches the probe (67). At this point, the sensor (65) will cause the chamber motor to shut down, so that the disposable liner bag/cassette (53) can be changed.

The size of the perforations in the rotary chamber (51) may range from 0.25 $mm^2$ to 25 $mm^2$ and the ratio of area of perforation to total area of the chamber wall may range from 20 to 95%. The material preferably used for the rotary chamber (51) and connected items is stainless steel. The material preferably used for the filter liner may be conventional paper, non-woven fabrics of rayon/polyester/propylene or cotton cloth. The mesh size of the filter liner may range from 5 $\mu m^2$ to 100 $\mu m^2$.

PLEATED FILTER BAG

Figure 3B:
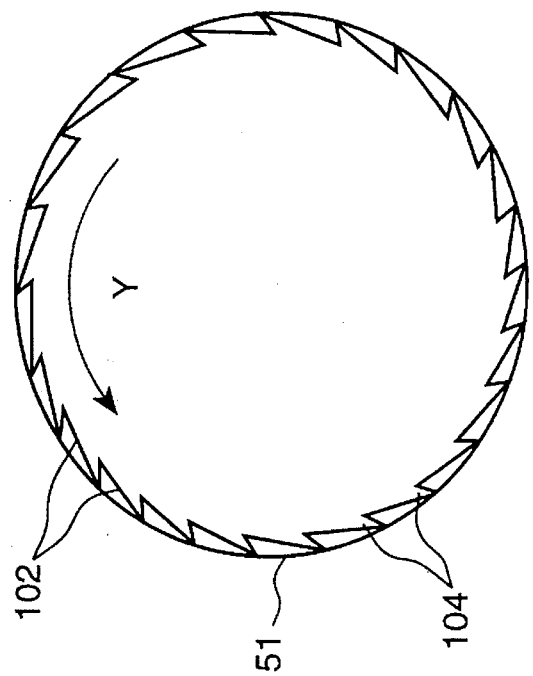
FIGS. 3a and 3b show respectively a side view (with part broken away) and a radial cross-sectional view of a rotatable centrifugal filter chamber of a filter unit in accordance with the invention, which chamber contains a pleated disposable bag.
Figure 3A:
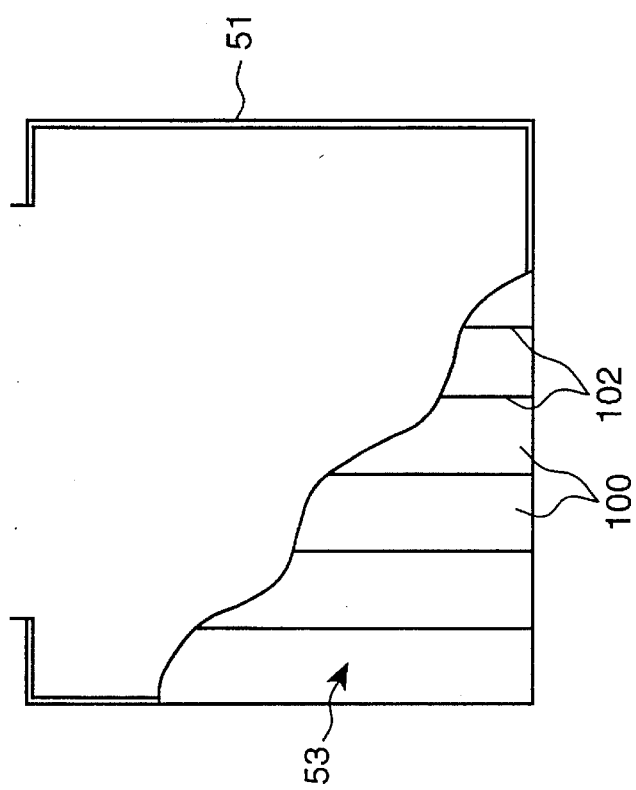

The disposable bag (53) may be provided, for example by folding and sewing at its top and bottom ends, with a plurality of pleats open between their top and bottom ends. As shown in FIGS. 3a and 3b, the bag (53), which is preferably of a relatively resilient pervious textile material, has a plurality of pleats (100) provided by respective fold lines (102) which may, for example, be spaced apart by about 1½".

The bag (53) is preferably of a diameter corresponding roughly to the internal diameter of the chamber (51). It may be fitted into the chamber (51) by pushing it through the slightly constricted mouth of the chamber (51) and is preferably sufficiently resilient that it can be compressed for insertion into the chamber but will easily expand to its original configuration once inserted so as to line the internal wall of the chamber. It can then be secured by fitting a resilient retaining ring (49) for cooperation with recess (47) as shown in FIG. 1.

We find surprisingly that, irrespective of the direction of the pleats relative to the direction of rotation of the chamber (51), enhanced particle collection efficiency can be achieved as compared with a bag which is not pleated. Thus, although the open mouths (104) of the pleats (100), when they move forwardly as the chamber (51) spins, provide improved collection efficiency, we find that particularly efficient particle collection is achieved if the open mouths (104) of the pleats move rearwardly as the drum rotates, ie in the direction Y as shown in FIG. 3b. As later described, it is believed that this is due to formation of vortices in the flow of the incoming liquid caused by the projections provided by the pleats.

The method and apparatus of the present invention may be used in many applications where it is desired to separate solids from liquids. The invention is of particular advantage in fluid waste treatment and is especially useful in, for example, the separation of suspended photopolymer solids from waste washout fluid created in the production of water washable, photopolymer relief printing and moulding plates. Indeed, the apparatus may be suitable for the treatment of waste wash out fluid from many commercially available washout photopolymer relief plates, commonly found on the market.

The filter unit may be suitable for attachment as an in-line working system or as an off-line non-recirculatory type unit. Thus, typical examples of uses of the filter unit are as follows:

1. as an integral part of automatic and manual in-line photopolymer plate processing equipment.
2. as a retrofitted or "add-on" unit to existing photopolymer plate processing equipment: such a unit may be fitted externally or internally as applicable;
3. as a stand-alone item/central treatment unit for a plurality of plate processing machines;
4. as a stand-alone item for use as a treatment unit for an existing holding, treatment or settlement tank system;
5. as a mobile stand-alone item for use as a treatment unit for any plate processing machine or total processing line;
6. as an intermediate treatment unit within a re-circulatory plate processing machine and/or system;
7. as an intermediate stage of a total filtration system, either total loss or re-circulatory.

As a particular example of a use of the filter unit and process of the invention, the following description refers to the composition of a typical photopolymer-containing washout fluid, which may be treated to separate the waste photopolymer in accordance with the invention.

The photopolymerisable composition present in water washable, photopolymer relief printing or moulding plates will typically comprise the following components:

a) a solvent soluble or solvent dispersible polymer;

b) at least one ethylenically unsaturated compounds; and c) a photopolymerisation initiator.

The solvent soluble or solvent=dispersible polymer (a) may be selected from, for example: polyamides, optionally having, in their main chain ether bonds and/or basic nitrogen, and optionally in the form of their or sulphonic acid salts; polyvinylalcohol; polyacrylamide and its derivatives; methylcellulose and hydroxy cellulose.

The ethylenically unsaturated compound (b) may be a (meth)acrylic ester or amide compound, for example a: (meth)acrylate or amide alkoxyalkyl (meth)acrylate or amide hydroxyalkyl (meth)acrylate or amide, for example, n-methylol (meth)acrylamide, haloalkoxyalkyl (meth)acrylate or amide glycidyl(meth) acrylate, alkyleneglycoldi(meth)acrylate, polyalkyleneglycoldi(meth)acrylate, (meth)acrylamide, or n,n'-alkylenebis(meth)acrylamide.

The amount of the ethylenically unsaturated compound in the washout fluid will usually be in the range of from 1 to 50% by weight of the solvent soluble polymer, but is preferably from 5 to 100%.

The photopolymerisation initiator (c) may be selected from, for example,: anthraquinones, benzophenone, Michler's ketone, benzoin, benzoin methyl ether, benzoin ethyl ether, benzoin isopropyl ether, $\alpha$-methylol benzoin, $\alpha$-methylol benzoin methyl ether, $\alpha$-methoxy benzoin ethyl ether, 2,2-diethoxyacetophenone and benzil. These may be used either alone or in combination. The photopolymerisation initiator will usually be added in an effective amount to induce polymerisation, typically 0.01 to 50% by weight based on the solvent-soluble polymer.

If desired, the photopolymerisable composition may further comprise a plasticiser and a thermal polymerisation inhibitor. Examples of plasticisers which may be used are glycols such as ethyleneglycol and diethyleneglycol, glycerine, N-methylbenzenesulfonamide and N-ethyl-p-toluenesulfonamide. The amount of plasticiser may be in the range of from 1 to 30% by weight, based on the photopolymerisable composition as a whole. Examples of thermal polymerisation inhibitors which may be used are hydroquinones, phenols and catechols. The amount of the inhibitor may be in the range of from 0.01 to 5% by weight, based on the total photopolymerisable composition.

A photopolymer relief plate may be made from the above mentioned photopolymerisable composition by the following methods:

A solution of the photopolymerisable composition is obtained by dissolving the above mentioned components in a solvent such as water, alcohol or a mixture of water and alcohol, usually under heat.

A photopolymerisable layer is formed from this solution by, for example, distilling off a major part of the solvent, heating the residue to obtain a photosensitive composition, then extruding it onto a base to obtain a moulding.

Another process for preparing the photosensitive layer comprises the steps of forming a photosensitive sheet by a dry film-forming method, and adhering the sheet to a base to form the photosensitive layer. Still another process comprises forming a film directly on the base by a dry film-forming method to form the photosensitive layer. The base may be selected from plates of metal and metal alloys, such as steel, stainless steel, aluminium and copper; plastic sheets such as polymer films; and synthetic rubber sheets such as styrene/butadiene copolymer sheets. The photosensitive layer preferably has a thickness of 0.1 to 10 mm.

A photopolymer relief printing or moulding plate which can be made by any of the above mentioned methods is used for the application of any of flat bed letter press printing, rotary letter press printing, dry offset printing, flexo printing, moulding and others.

A relief printing image is formed from the photosensitive resin composition as described above by bringing a negative or positive original image film into close relationship with the photosensitive layer prepared as above and then subjecting the film and unprotected areas of the photosensitive layer behind the film to irradiation with U.V rays from a high pressure mercury lamp, ultra-high pressure mercury lamp, metal halide lamp, xenon lamp, carbon arc lamp or chemical lamp of generally between 300 and 400 nm wavelength to insolubilise the exposed photosensitive composition by a photopolymerisation reaction.

Thereafter, the unpolymerised (non-irradiated) area is washed out by means of a spray-type or brush-type developing device with water, to form a relief. The washout out photopolymer composition is now found as suspended solid particles and/or dissolved materials, within the waste washout fluid from the developing device (washout apparatus). The present invention provides an effective and economical method for separating and removing the photopolymer from the waste washout fluid, by filtration, using centrifugal forces to exert a physical pressure upon the suspended solid particles.

The separated photopolymer may then be incinerated and the filtered water may be released to city drain or other appropriate outlets, the photopolymer having mostly been removed.

For optimum washout during the process for preparing a relief printing plate, the washout liquid is preferably at a temperature of from 15° C. to 25° C. inclusive. Although separation of solid materials from the washout solid/liquid mixture can also be carried out at this temperature, especially if the mixture has been pretreated with a coagulant aid, it is preferable to improve coagulation prior to separation by preheating the mixture in a preheater unit (40), as shown in the drawings so as to raise the temperature of the solid/liquid material to a temperature from 25° C. to 80° C., usually more preferably 45° to 50° C.

In general, the higher the temperature the larger the particles. However, we find that increasing the particle size beyond about 500 µm serves no useful purpose. For relatively hard water this is achieved at about 56° C.

In order to achieve this increase in temperature of a continuously flowing washout fluid, flowing through a pipe of say 18" in length, it is usually necessary for the temperature within the pretreatment unit to reach 250° C.–300° C. and for the water to have a residence time in the main flow pipe (46) of about 1½ seconds.

The heat treatment temperature selected depends upon the hardness of the water, harder water preferably being heat treated at around 50° C. but soft water preferably being treated at around 80° C.

We have found that the provision of such a preheated unit (40) was able greatly to increase the efficiency of the filter unit.

In particular the coagulation pretreatment process converted a solid/liquid mixture comprising fine particles dispersed in water to a yoghurt-like mass. This meant that large coagulated lumps were introduced into the rotating chamber instead of fine particles, thus allowing the capture of more particles without blocking ("blinding") the filter bag.

We also found that the filter bag gave longer life in addition to recovery efficiency.

In an especially preferred process, the waste water is heat treated in the pre-filtration treatment chamber and/or organic/inorganic coagulants are added to the waste washout fluid prior to filtration, again to enhance performance. Examples of inorganic coagulants which may be used are sodium chloride, sodium bromide, potassium chloride, calcium chloride, aluminium sulphate and sodium sulphate. Examples of organic coagulants which may be used are poly methyl (meth)acrylate, copolymers thereof with, for example, methacrylamide and copolymers of maleic anhydride with glycols capable of providing methylvinyl ether units.

Respective Experiments 1 and 2 were carried out in order to illustrate the advantages provided by a specially profiled disposable filter bag (Experiment 1) and the effectiveness of increasing coagulation of particles in a washout fluid from manufacture of a printing plate, by means of a preheated unit (Experiment 2).

EXPERIMENT 1

A centrifugal filter unit as illustrated in FIG. 2 was used to filter washout fluid from a process for producing a relief plate and containing suspended solid particles of photopolymer.

In both Examples 1 and 2 below a pervious textile material (the same in each case) was used as the liner bag (53) which was placed into a chamber (51) comprising a rotatable drum and retained in place by means of retaining clips.

The only difference between the procedures of respective Examples 1 and 2 was that in Example 1 a non-profiled liner bag (53) was used, whereas in Example 2, the liner bag was profiled.

In particular, the bag was folded and sewn at top and bottom so as to gather a number, typically 20–30, of pleats open between their top and bottom ends. The bag was so disposed in the drum that the pleat openings moved rearwardly on spinning the drum (see arrow Y in FIG. 3b).

Test conditions were based on a constant spin speed and a pre-measured quantity of solid photopolymer waste. The waste material was introduced into the water at the start of the process for eventually recovery by the filter at the end of the line.

In each of Examples 1 and 2 the same spin speed and same pre-measured quantity of solid photopolymer were used and results were compared.

| Spin speed | Water Temp | Weight of waste material prior to filtration | Recovered at filter |
| --- | --- | --- | --- |
| Example 1 - Non-profiled bag | | | |
| 750 rpm | 42° C. | 1,000 gms | 509 gms |
| Example 2 - Profiled bag | | | |
| 750 rpm | 42° C. | 1,000 gms | 707 gms |

Results: profiled bag gave a 38.9% higher recovery rate.

Although not wishing to be bound by theory, it was thought that the profiled bag improved the recovery rate for the following reasons.

1) The surface area of the filter medium was considerably increased by the addition of the folds.
2) The open mouths of the folds probably created a secondary vortex providing greater internal surface agitation, so aiding the collection process by dispersing the suspended solid particles and generally giving a more even weight of cover per square inch of bag surface.

3) The outer wall profile of the bag offered additional catchment areas/crevices on to which suspended photopolymer particles could more easily adhere.

It was also observed that a benefit of the profiled bag in addition to its enabling greater capture was in the extended life of the bag. The bag recovered more and lasted longer by virtue of the efficiency of the profile as well as the increase of filtration surface offered by the folds.

EXPERIMENT 2

'Sample A': Taken from the wash-out liquid from manufacture of a photopolymer printing plate. The sample was taken at the point of drainage from the washout section catchment tray prior to the pre-heater unit and centrifugal filtration unit.

'Sample B': Taken from the same machine, carrying out the same operation, immediately after 'Sample A' had been taken. However, the point of extraction was after the pre-heater unit, but before the centrifugal filtration unit.

Both samples were then measured on a Malvern spectrometer to determine the particle size of suspended solids within the waste wash-out fluid. The growth in particle size within 'Sample B' when compared to 'Sample A' was a direct result of the operation and functionality of the pre-heater unit.

This growth in particle size, described as coagulation, is of benefit to the operation and efficiency of the centrifugal filtration unit.

The processes embodying the invention described above can provide a very effective filtration and separation of the photopolymer and other undesirable solid materials from the waste washout fluid of water washable photopolymer printing and moulding plates.

The process is suitable for the treatment of waste washout fluid of commercially available water washout photopolymer relief plates. Examples of such plates are: TORELIEF 'W' types manufactured by Toray Industries Inc, Japan, and PRINTIGHT manufactured by Toyobo Co. Ltd, Japan.

It can be seen that the process may be used to provide a filtration system which is environmentally friendly and protective of natural resources and ensures quick and efficient removal of waste substances thus preventing them from entering a water drainage system.

The printing plate manufacturing process may thus be carried out safely and the waste material processed efficiently and quickly by means of a continuous process.

We claim:

1. A process for separating solid material from a waste washout liquid containing liquid washable photopolymer from a printing plate manufacturing process, the separating process comprising the steps of:

providing a centrifugal filter unit comprising a rotatable filter chamber;

removably securing within the chamber a collector, which collector comprises a bag pervious to the washout liquid and having a plurality of projecting portions extending inwardly of the bag;

| TEST PARAMETERS | |
| --- | --- |
| DATE | 22.09.92 |
| LOCATION | DANTEX TESTING CENTRE |
| PROCESSOR | DTP-480III |
| PLATE MATERIAL | WF-950II PHOTOPOLYMER PLATE TYPE |
| PLATE SIZE | 600 × 400 × 0.95 mm |
| WASHED OUT AREA | 100% |
| WASH-OUT WATER TEMPERATURE | 35° C. |
| POINT OF SAMPLE | @ PLATE 100% UNDER BRISTLE |
| MACHINE THROUGHPUT SPEED | 4.5 (200 mm per Minute) |
| WATER FLOW AT PRE-HEAT UNIT | 5 liters per Minute |
| INNER WALL TEMPERATURE OF PRE-HEAT UNIT | 250° C. |
| INITIAL TEMPERATURE OF WASTE WATER INTO PRE-HEAT UNIT | 31° C. |
| WATER TEMPERATURE OUT OF PRE-HEAT UNIT | 45° C. |

| TEST RESULTS MALVERN SPECROMETER - SUMMARY | | |
| --- | --- | --- |
| PARTICLE SIZE μm | TEST A | TEST B |
| MAXIMUM PARTICLE SIZE DETECTED | 188 | 564 |
| MINIMUM PARTICLE SIZE DETECTED | 1.9 | 5.8 |
| D50 VALUE (Mean Value, i.e. 50%) | 8.0 | 65.0 |

Values given are nominal and subject to interpretation by the Malvern specrometer to measure spherical particles.

Along with the growth in particle size, a change in particle shape was also evident when viewed under a microscope. The particle shape of the heated sample (Test B) was more uniform (spherical) than in the unheated sample (Test A) which had a more extended particle shape (stringy). The more uniform particles obtained in Test B, would pack better within the fibres of the filter bag and thus create a more efficient filter bed; hence the higher recovery rate.

feeding the washout liquid into the chamber while rotating the chamber so as to allow centrifugal deposition of the solid material on the collector within the rotating chamber, whereby the projecting portions modify the flow of the washout liquid within the chamber during rotation thereof and thereby improve efficiency of deposition of the solid material on the collector; and thereafter removing the collector and solid material deposited thereon from the chamber.

2. A process according to claim 1, wherein the bag is folded so as to gather pleats sewn in position at top and bottom end regions of the bag, which pleats are open between their top and bottom ends to define open mouths of the pleats, and the flow of the washout liquid is modified by the open mouths of the pleats.

3. A process according to claim 2, wherein the openings of the pleats move rearwardly as the chamber rotates.

4. A process according to claim 1, wherein the chamber is perforate and at least a portion of the liquid is separated from the solid material by passage through the pervious bag and perforate chamber.

5. A process according to claim 1, wherein during the separation of the solid material from the washout liquid the washout liquid is at a temperature of from 15° to 80° C.

6. A process according to claim 5, wherein the said temperature of the washout liquid is from 25° to 80° C.

7. A process according to claim 1, further including, prior to the step of feeding the washout liquid into the filter chamber, the step of preheating the washout liquid to coagulate the solid material therein.

8. A process according to claim 7, wherein the washout liquid is heated to a temperature of from 30° to 80° C.

9. A process according to claim 1, wherein the projecting portions within the bag are pleats, flaps or corrugations.

10. A process according to claim 9, wherein the bag is folded so as to gather pleats, which are sewn in position at top and bottom end regions of the bag, but are open between their top and bottom ends.

11. A process according to claim 1, wherein the filter unit optionally additionally comprises an openable lid of the chamber, at least one of the chamber and lid carrying the means for releasably retaining the collector within the chamber.

12. A process according to claim 1, wherein the said retaining means comprises a resilient retaining ring and a profiled mouth portion of the chamber, the profiled mouth portion providing a generally cylindrical inner surface of the mouth portion and a circumferential, essentially V-shaped recess in the generally cylindrical inner surface of the mouth portion, the resilient retaining ring urging a part of a mouth portion of the bag into the recess so as to trap the said part between the resilient retaining ring and the profile mouth portion of the chamber and hold the bag in position within the chamber.

13. A process for separating solid material from waste washout water containing water washable photopolymer from a printing plate manufacturing process, which separating process comprises the continuous steps of:

supplying the waste washout water to a preheater unit;

heating the waste washout water in the preheater unit to coagulate solid material in the waste washout water;

feeding the waste washout water containing the coagulated solid material to a centrifugal filter unit comprising a perforate rotating centrifugal filter chamber containing a collector comprising a removable pervious filtration bag;

collecting the coagulated solid material on the removable pervious filtration bag, while allowing permeation of the washout water through the pervious filtration bag and perforate rotating chamber; and after termination of the said continuous steps, removing the removable filtration bag containing the collected coagulated solid material.

14. A process according to claim 13, wherein the removable pervious filtration bag is folded so as to gather pleats sewn in position at top and bottom end regions of the bag, which pleats are open between their top and bottom ends to define open mouths of the pleats, whereby the open mouths of the pleats modify the flow of the washout liquid within the chamber during rotation thereof and thereby improve efficiency of deposition of the solid material on the said filtration bag.

15. A centrifugal filter unit for separation of solid material from a waste washout liquid containing liquid washable photopolymer from a printing plate manufacturing process, which filter unit comprises:

a centrifugal filter chamber rotatable so as to allow deposition of the solid material from the waste washout liquid;

a collector removable from but retainable within the chamber for collection of the deposited solid material, which collector is a liner comprising a bag pervious to the washout liquid and having a plurality of projecting portions extending inwardly of the bag; and means for releasably retaining the collector within the chamber.

16. A centrifugal filter unit according to claim 15, wherein the projecting portions with the bag are pleats, flaps and corrugations.

17. A centrifugal filter unit according to claim 16, wherein the bag is folded so as to gather pleats sewn in position at top and bottom end regions of the bag, which pleats are open between their top and bottom ends.

18. A centrifugal filter unit according to claim 15, which optionally additionally comprises and openable lid of the chamber, at least one of the chamber and lid carrying the means for releasably retaining the collector within the chamber.

19. A centrifugal filter unit according to claim 15, wherein the said retaining means comprises a resilient retaining ring and a profiled mouth portion of the chamber, the profiled mouth portion providing a generally cylindrical inner surface of the mouth portion and a circumferential, essentially V-shaped recess in the generally cylindrical inner surface of the mouth portion, the resilient retaining ring urging a part of a mouth portion of the bag into the recess so as to trap the said part between the resilient retaining ring and the profiled mouth portion of the chamber and hold the bag in position within the chamber.

20. A centrifugal filter unit according to claim 15, wherein the chamber is perforate so as to allow escape of liquid through the bag and through the perforate chamber.

21. A centrifugal filter unit according to claim 15, which additionally comprises, upstream of the centrifugal filter chamber, a preheater unit capable of coagulating photopolymeric waste washout liquid prior to filtration thereof.

* * * * *